United States Patent [19]

Nayak et al.

[11] Patent Number: 5,757,204
[45] Date of Patent: May 26, 1998

[54] METHOD AND CIRCUIT FOR DETECTING BORON ("B") IN A SEMICONDUCTOR DEVICE USING THRESHOLD VOLTAGE ("V") FLUENCE TEST

[75] Inventors: Deepak Kumar Nayak, Santa Clara; Ming-Yin Hao, Sunnyvale; Rajat Rakkhit, Milpitas, all of Calif.

[73] Assignee: Advanced Micro Devices, Inc., Sunnyvale, Calif.

[21] Appl. No.: 620,802

[22] Filed: Mar. 28, 1996

[51] Int. Cl.$^6$ .................................................. G01R 31/26
[52] U.S. Cl. ........................................ 324/769; 324/765
[58] Field of Search ................... 324/765, 766, 324/767, 768, 769; 438/6, 15, 16, 17, 18

[56] References Cited

U.S. PATENT DOCUMENTS

5,538,904  7/1996  Mitani et al. ...................... 438/17
5,648,288  7/1997  Williams et al. ................... 438/17

*Primary Examiner*—Ernest F. Karlsen
*Attorney, Agent, or Firm*—Fliesler, Dubb, Meyer & Lovejoy LLP

[57] ABSTRACT

A method and circuit for detecting boron at an interface between a p-type polysilicon gate and silicon dioxide gate dielectric is provided. A $V_t$ fluence test using about $-6.67$ mA/cm$^2$ is used to detect boron at the interface. A p-channel metal oxide semiconductor ("PMOS") device having a source, drain, substrate, gate and silicon dioxide layer are connected to ground and a current source in order to detect the boron. An about $-6.67$ mA/cm$^2$ current is applied to the PMOS gate while the source, substrate and drain are grounded. Various changes in threshold voltages are observed over different stress times. The boron concentration at the polysilicon/gate dielectric interface has been detected by the shift in threshold voltage. The concentration of boron at the interface has been found to degrade oxide quality as evidenced by charge-to-breakdown ("$Q_{BD}$") test of the oxide.

28 Claims, 10 Drawing Sheets

QUASI-STATIC C-V FOR DIFFERENT ANNEALING TEMPERATURES

FIG. 1
(PRIOR ART)

QUASI-STATIC C-V FOR DIFFERENT POLY $BF_2$ IMPLANT ENERGY

LONG-CHANNEL Vt AND Gm FOR DIFFERENT ANNEALING TEMPERATURE

*FIG. 4* (PRIOR ART)

LONG-CHANNEL Vt AND Gm FOR DIFFERENT $BF_2$ IMPLANT ENERGY

*FIG. 5* (PRIOR ART)

Vt SHIFT FOR HOLE INJECTION FOR DIFFERENT ANNEALING TEMPERATURES

FIG. 6

Vt SHIFT FOR HOLE INJECTION FOR DIFFERENT BF$_2$ IMPLANT ENERGY

FIG. 7

CHARGE-TO-BREAKDOWN FOR DIFFERENT ANNEALING TEMPERATURES
*FIG. 8*

METHOD AND CIRCUIT FOR DETECTING BORON ("B") IN A SEMICONDUCTOR DEVICE USING THRESHOLD VOLTAGE ("V") FLUENCE TEST

BACKGROUND OF THE INVENTION

1. Field of the Invention

The invention relates to semiconductor devices, and in particular, to detecting boron in a semiconductor device.

2. Description of the Related Art

In manufacturing semiconductor devices, boron is often used as a dopant in creating ("p-type") semiconductor regions on a silicon ("Si") substrate or wafer. For example, boron may be used in creating a source region and drain region of a transistor in a complimentary metal oxide semiconductor ("CMOS") device. Likewise, boron may be implanted in creating a CMOS p-type polysilicon gate and, in particular, a p-type polysilicon gate in a p-channel metal oxide semiconductor ("PMOS").

A source region and drain region is generally formed with boron at an implant energy of about 30 KeV yielding a concentration of about $1 \times 10^{15}/cm^2$ in a p-type implant region. Rapid thermal annealing ("RTA") temperatures, generally in a range from about 975° C. to 1,025° C., is used to activate boron.

While boron is often used in creating p-type regions, introducing boron into other semiconductor regions may create semiconductor reliability problems. As CMOS device dimensions decrease in order to enable faster switching speeds, the concentration of boron on or near a p-type polysilicon gate and gate dielectric interface has a greater effect on PMOS voltage characteristics and thus reliability. For example, boron may penetrate a gate dielectric, such as a silicon dioxide ("SiO$_2$") layer, from a p-type polysilicon gate. Boron on or near the interface between the gate silicon dioxide layer and the polysilicon gate, and the oxide on the substrate may cause a plurality of reliability problems, such as: 1) threshold voltage ("V$_t$") instability may occur; 2) flatband voltage ("V$_{fb}$") may shift; 3) channel mobility and subthreshold slope may degrade; 4) charge-to-breakdown ("Q$_{BD}$") may lower; 5) oxide trapping centers may increase for p-channel devices.

Previously, boron penetration into or near the gate silicon dioxide layer and the substrate Si-interface could be detected by observing changes in V$_t$ and V$_{fb}$. Yet, there is not a method for detecting boron concentration at the gate silicon dioxide layer and polysilicon gate interface. Accordingly, there is not a method for determining whether CMOS semiconductors are defectively being manufactured at temperatures and implant energies which cause boron introduction at this interface.

Thus, it is desirable to create a method for quantitatively identifying the amount of boron concentration at the polysilicon gate/gate dielectric interface in a CMOS device. By detecting the amount of boron at the polysilicon gate/gate dielectric interface, in particular the interface between a p-type polysilicon gate and an SiO$_2$ layer, at various implant energies and RTA temperatures, manufacturing modified in order to decrease boron concentration at the interface and thus increase the reliability of a PMOS device.

SUMMARY OF THE INVENTION

It is therefore an object of the present invention to provide a method and circuit for detecting boron at an interface between a p-type polysilicon gate and a gate dielectric.

It is a further object of the present invention to provide a method and circuit for detecting the degradation of a PMOS cell due to concentration of boron at a p-type implanted polysilicon gate and SiO$_2$ gate dielectric for various manufacturing process steps, including RTA temperatures, implant energies and other temperature cycles in a process.

These and other objects of the invention are provided, as a first aspect, in a method for detecting boron in a semiconductor device having a substrate region, source region, drain region, gate region and gate dielectric region. The method generally comprises the steps of: measuring a first threshold voltage value; grounding the source region, drain region and substrate region; applying a current to the voltage gate region; measuring a second threshold voltage value; and comparing the first threshold voltage value to the second threshold voltage value to determine if boron is present.

In another aspect, the current is a negative current in a range of about $-1$ to $-20$ mA/cm$^2$. Preferably, the current is about $-6.67$ mA/cm$^2$. In another aspect of the invention, the length of the gate region is about 0.35 μm and the oxide layer region is about 70 Å thick. The source region and drain region has a boron concentration of about $1 \times 10^{15}/cm^2$. Similarly, the boron concentration in the gate region is about $1 \times 10^{15}/cm^2$. The present invention could also be carried out using a semiconductor device having different dimensions and concentration levels. Further, the semiconductor device may be used in a microprocessor, complex programmable logic device, memory device or the like.

In still another aspect of the present invention, a method for detecting boron at a p-type polysilicon gate region and an SiO$_2$ region interface in a p-channel metal oxide semiconductor ("PMOS") device is provided. The PMOS device includes a source and a drain on a substrate. The p-type polysilicon gate region forms a gate over the SiO$_2$ region. The method comprises the steps of grounding the source, drain and substrate. Current is then injected into the p-type polysilicon region. The threshold voltage is then measured.

In another aspect of the present method, the measuring step includes the step of measuring a first threshold voltage value before the injecting step. A second threshold voltage value is then measured after the injecting step. The first threshold value and the second threshold value is then compared to determine the relative amount of boron at the interface.

In another aspect of the method, the PMOS semiconductor device undergoes a rapid thermal annealing temperature in the range of about 975° C. to about 1,025° C. The PMOS semiconductor device also undergoes a BF$_2$ implant energy in the range of about 30 KeV to about 40 KeV.

In still another aspect of the present invention, a circuit for detecting boron in a PMOS device at an interface between a PMOS gate and a PMOS gate dielectric is provided. A negative current source is coupled to the PMOS gate for providing a negative current. A ground is coupled to 1) a PMOS source, 2) a PMOS drain and 3) a PMOS substrate. Means for measuring voltage is then coupled to the gate and source. The means for measuring indicates the relative amount of boron at the interface.

In still another aspect of the present invention, the current is approximately $-6.67$ mA/cm$^2$ and is applied for approximately 200 seconds.

DETAILED DESCRIPTION

Figure 10A:
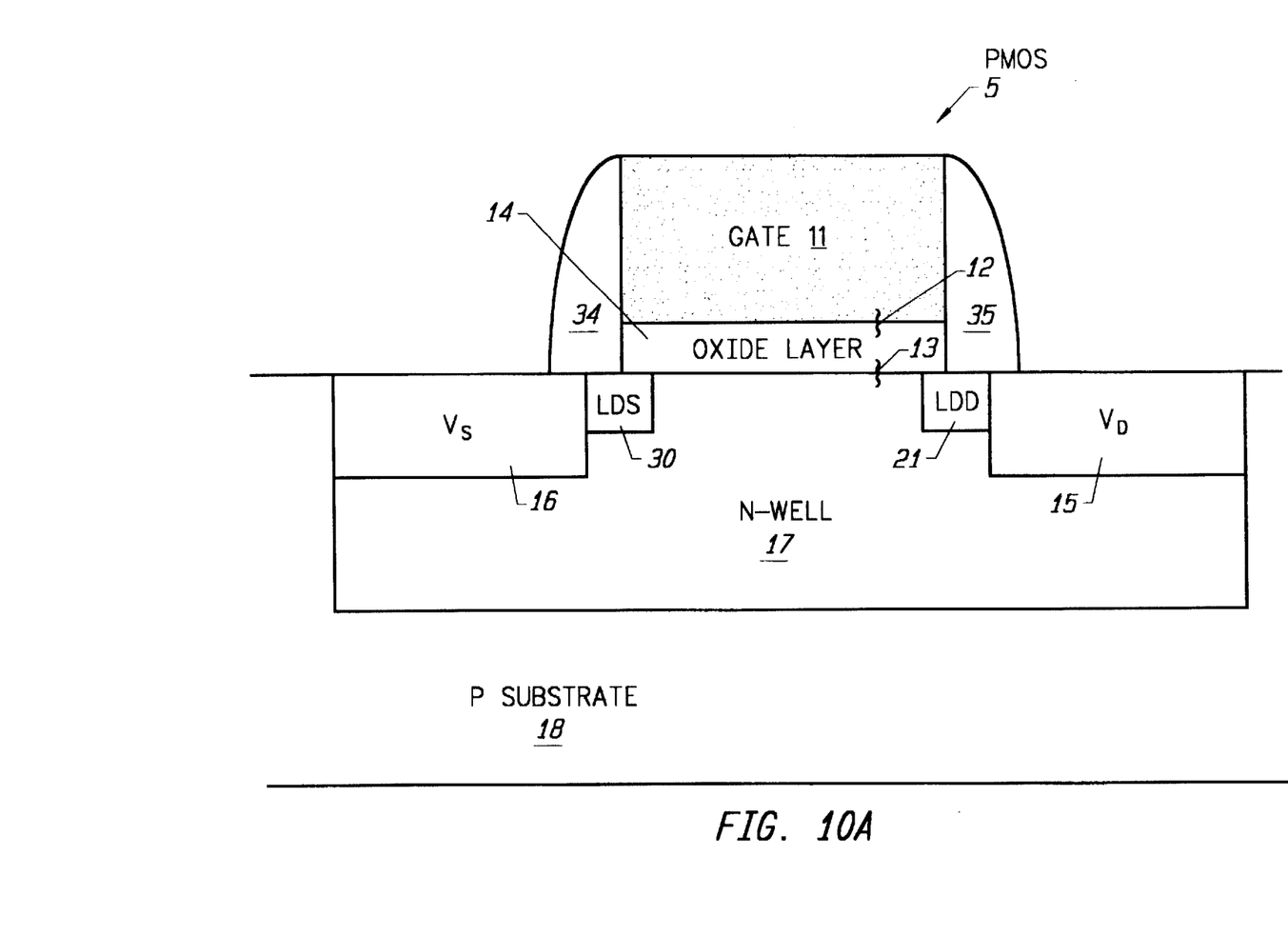
FIGS. 10a–b illustrate detecting boron in a PMOS device according to the present invention.

FIG. 10a illustrates a positive metal oxide semiconductor ("PMOS") device 5. In an embodiment, PMOS device 5 may be part of a complementary metal oxide semiconductor ("CMOS") device. It should be understood that only a generally wafer cross-section is illustrated in FIG. 10a. Also, one of ordinary skill in the art would understand the various conventional chemical vapor deposition and etching steps are necessary to form PMOS device 5. Likewise, one of ordinary skill in the art would understand that various RTA temperatures and implant energies would yield different device dimensions and voltage characteristics. While the present invention is described with respect to a PMOS device, one of ordinary skill in the art could likewise apply the present invention to an n-channel metal oxide semiconductor ("NMOS") device to detect arsenic or phosphorous.

PMOS device 5 includes a substrate 18 and n-well 17. In an embodiment, n-well 17 is an n-type implant region and substrate 18 is p-type silicon ("Si"). Source ("$V_S$") 16 and drain ("$V_D$") 15 are formed in n-well 17 as is known in the art by creating a p-type implant region. In an embodiment, $V_S$ 16 and $V_D$ 15 have a boron concentration of about $1\times10^{15}/cm^2$. $V_S$ 16 and $V_D$ 15 likewise include lightly doped source ("LDS") 30 and lightly doped drain ("LDD") 21. LDS 30 and LDD 21, in an embodiment, have a boron concentration of about $4\times10^{13}/cm^2$. Gate 11 is formed on substrate 18 over a gate dielectric 14. Gate 11, in the preferred embodiment, is a p-type polysilicon having about a 0.35 µm length gate and about a 2500 Å thickness. In an embodiment, the boron (B) concentration is about $1\times10^{15}/cm^2$. In an embodiment, gate dielectric layer 14 is an $SiO_2$ layer ("oxide layer") having about 70 Å thickness. Oxide spacers 34 and 35 are also positioned next to gate 11. The present invention detects the concentration of boron at interface 12 and/or 13 or the gate 11 and oxide layer 14 interface and the oxide layer 14 and substrate 18 interface, respectively.

PMOS device 5 is typically used in electrical devices, such as microprocessors, programmable logic devices, memory devices and the like.

Figure 1:
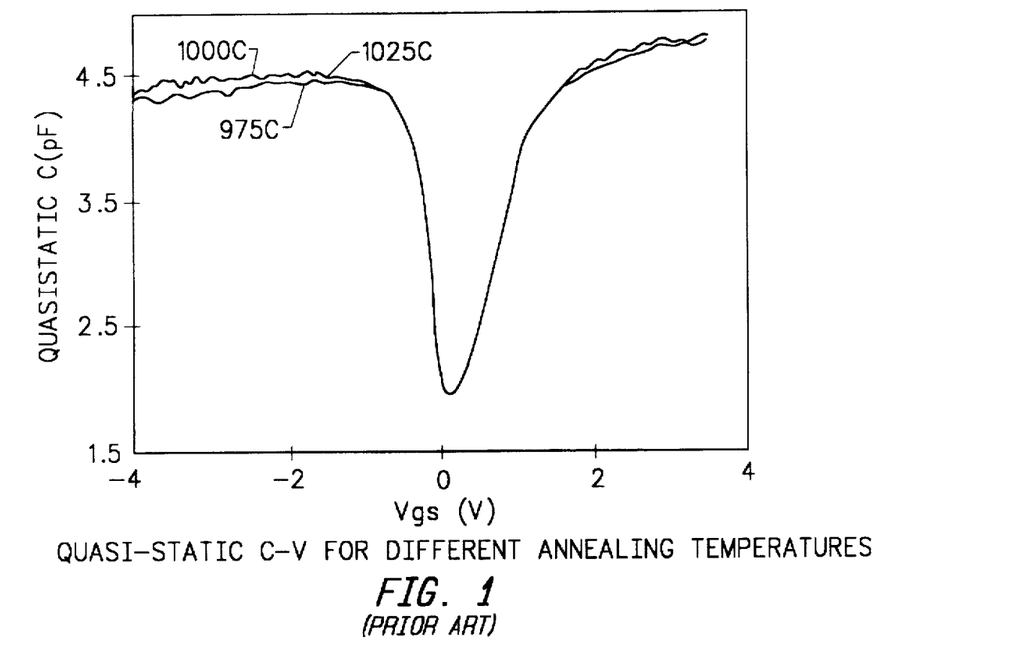
FIG. 1 illustrates a quasi-static capacitance ("C") versus gate-source voltage ("Vgs") curves for different RTA temperatures.
Figure 2:
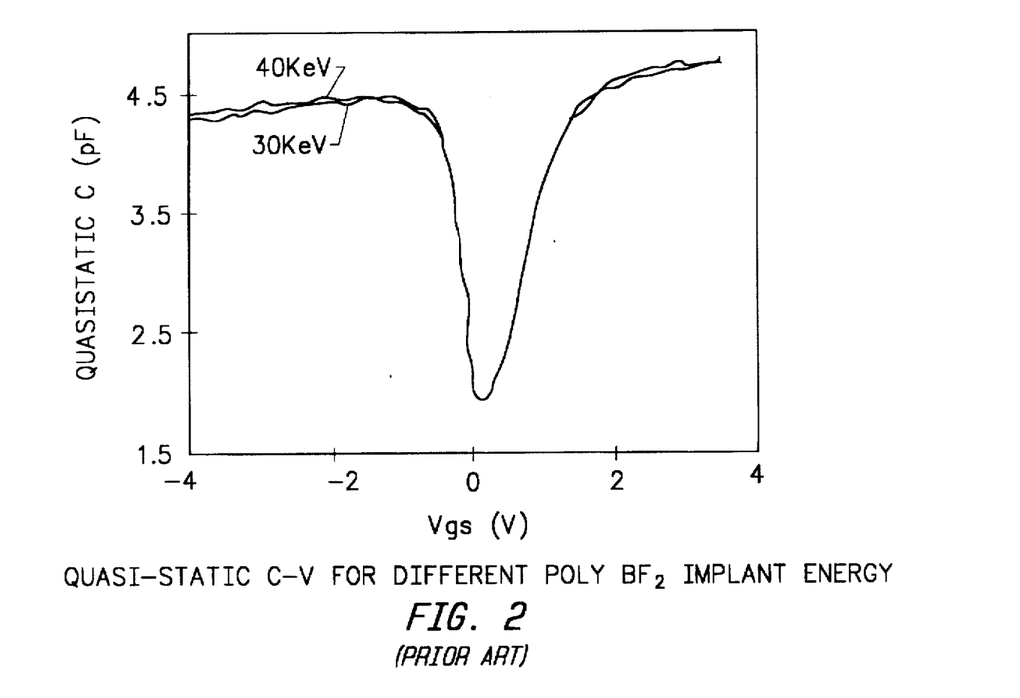
FIG. 2 illustrates a quasi-static capacitance ("C") versus gate-source voltage ("Vgs") curves for different poly $BF_2$ implant energies.
Figure 3:
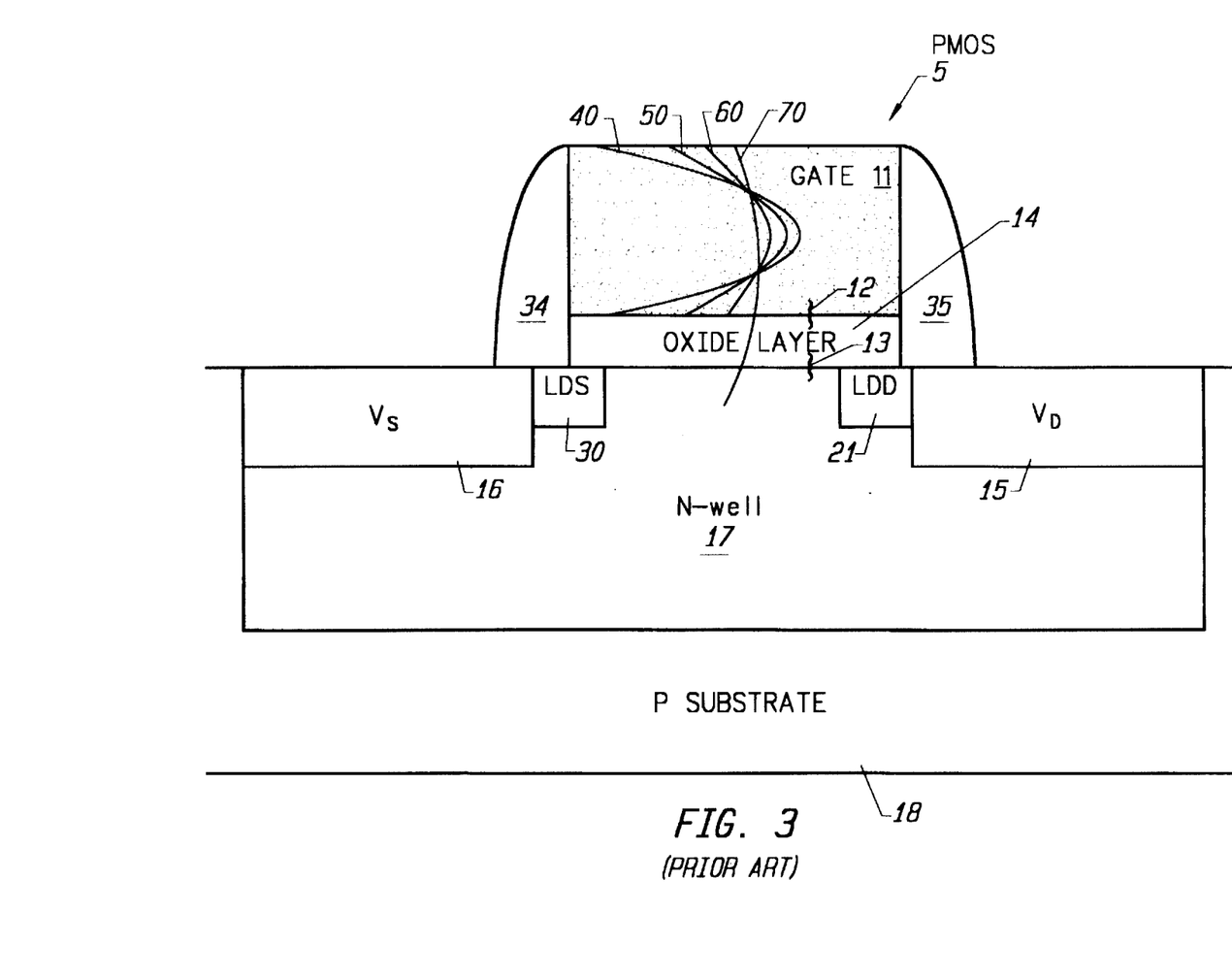
FIG. 3 illustrates long-channel threshold voltage ("$V_t$") and transconductance ("Gm") curves for different RTA temperatures.
Figure 4:
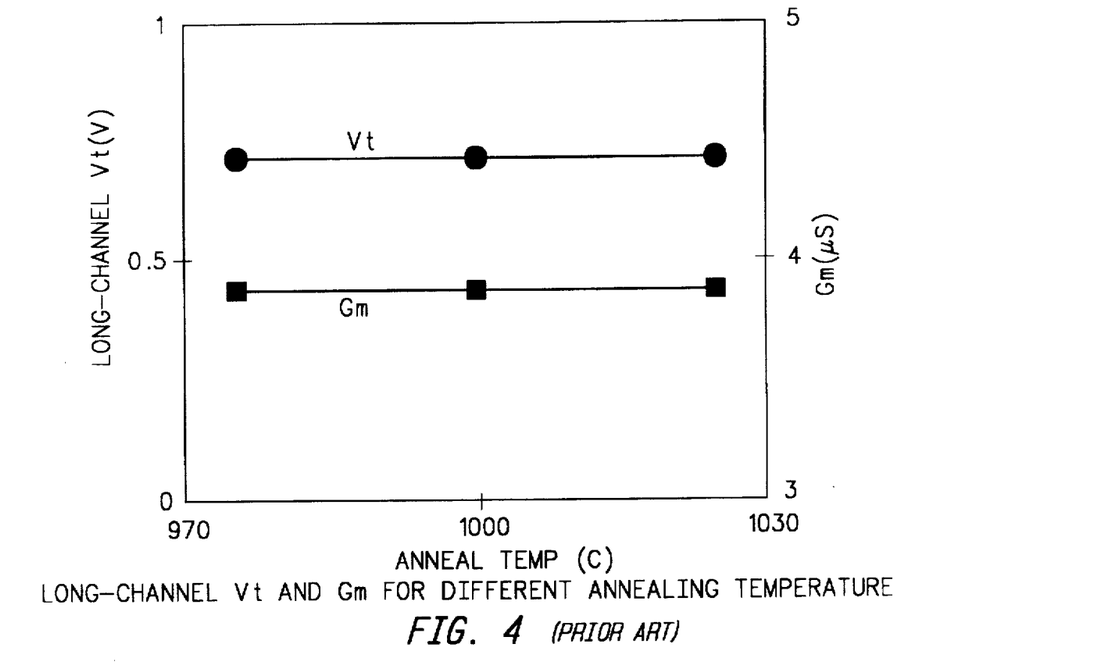
FIG. 4 illustrates boron concentration at various RTA temperatures and at a constant implant energy.

FIGS. 1–5 illustrate the characteristics of PMOS device 5 under a variety of semiconductor manufacturing process steps. In particular, these figures describe the quasistatic capacitance ("C"), threshold voltage ("$V_t$")and transconductance ("Gm") under particular implant energies and RTA temperatures. FIG. 1 illustrates quasistatic capacitance ("C") for PMOS device 5 manufactured under three different RTA temperatures when a voltage is applied between gate 11 and $V_S$ 16. As can be seen by FIG. 1, the 1,000° C. and 1.025° C. curves give higher capacitance in inversion (–4 V<Vgs<–1 V), while the 975° C. curve results in reduced quasistatic capacitance C. This lower capacitance at 975° C. is due to polysilicon depletion, which is not desirable in CMOS technology. The polysilicon depletion effect signifies that the boron concentration at interface 12 is not high. FIG. 4 illustrates curves 40, 50, 60 and 70 which represent the amount of boron at various RTA temperatures and at a constant implant energy. As can be seen, curve 70 illustrates a boron contamination in N-well 17 at a particular RTA temperature. Similarly, FIG. 2 illustrates the relationship between quasistatic capacitance C of PMOS device 5 and various $BF_2$ implant energies. A larger implant energy of about 40 KeV in manufacturing PMOS device 5 will result in higher quasistatic capacitance C.

Figure 5:
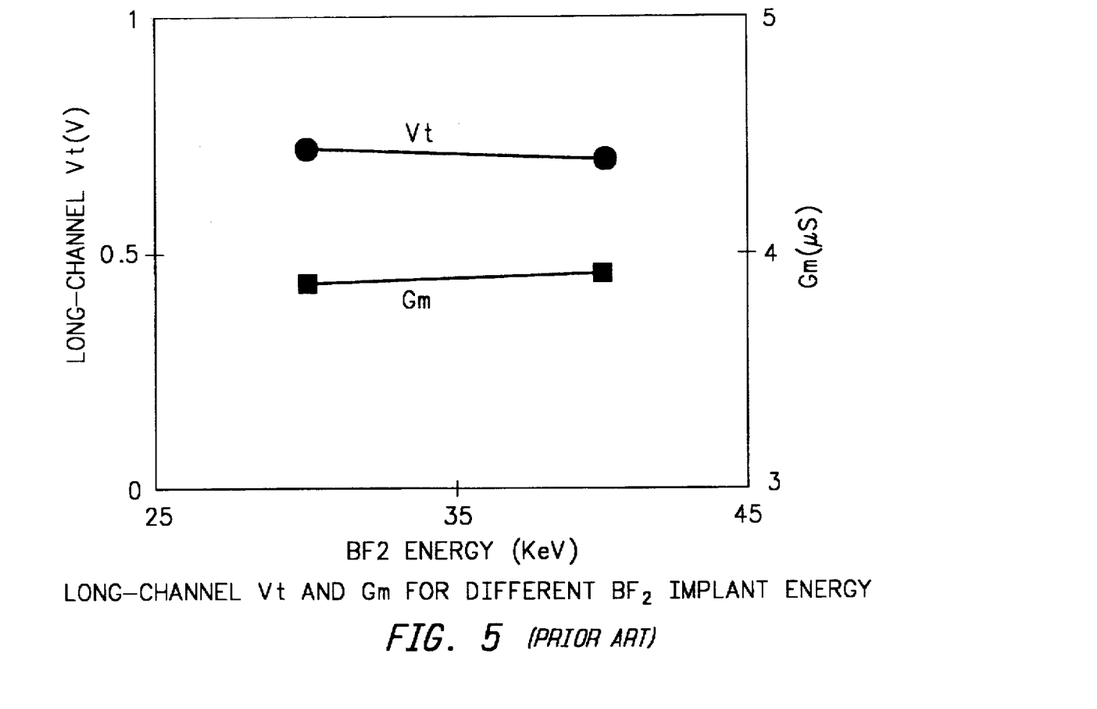
FIG. 5 illustrates long-channel threshold voltage ("$V_t$") and transconductance ("Gm") curves for different $BF_2$ implant energies.

FIGS. 4 and 5 illustrate linear long-channel threshold voltage ("$V_t$") and transconductance Gm at the above-cited RTA temperatures and implant energies. Only slight deviations $V_t$ and Gm, if any, are observed for RTA temperatures of about 975° C., 1,000° C., 1.025° C. and implant energies of about 30 KeV and 40 KeV. These results imply that the amount of boron at interface 13 is negligible.

Thus, using conventional methods as illustrated by FIGS. 1–5, PMOS device 5 appears to have typical voltage characteristics and thus operate properly and reliably under these manufacturing process step RTA temperatures and implant energies. Detrimental concentrations of boron at the gate interfaces do not appear to be indicated by FIGS. 2–5. Yet, as is described below, boron concentration under these RTA temperatures and implant energies at interface 12 is detected in PMOS device 5 using the present method and circuit described below.

Figure 10B:
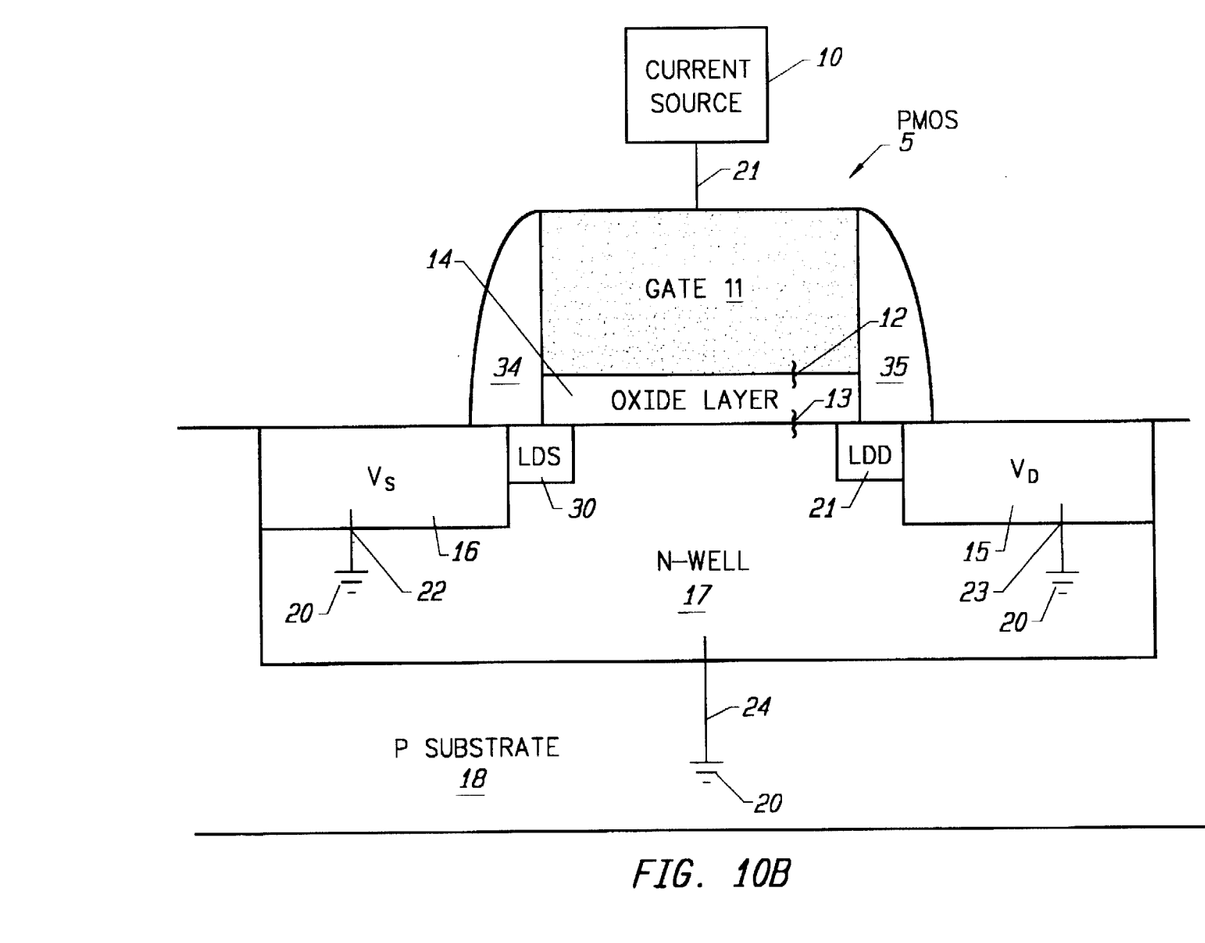
Figure 11:
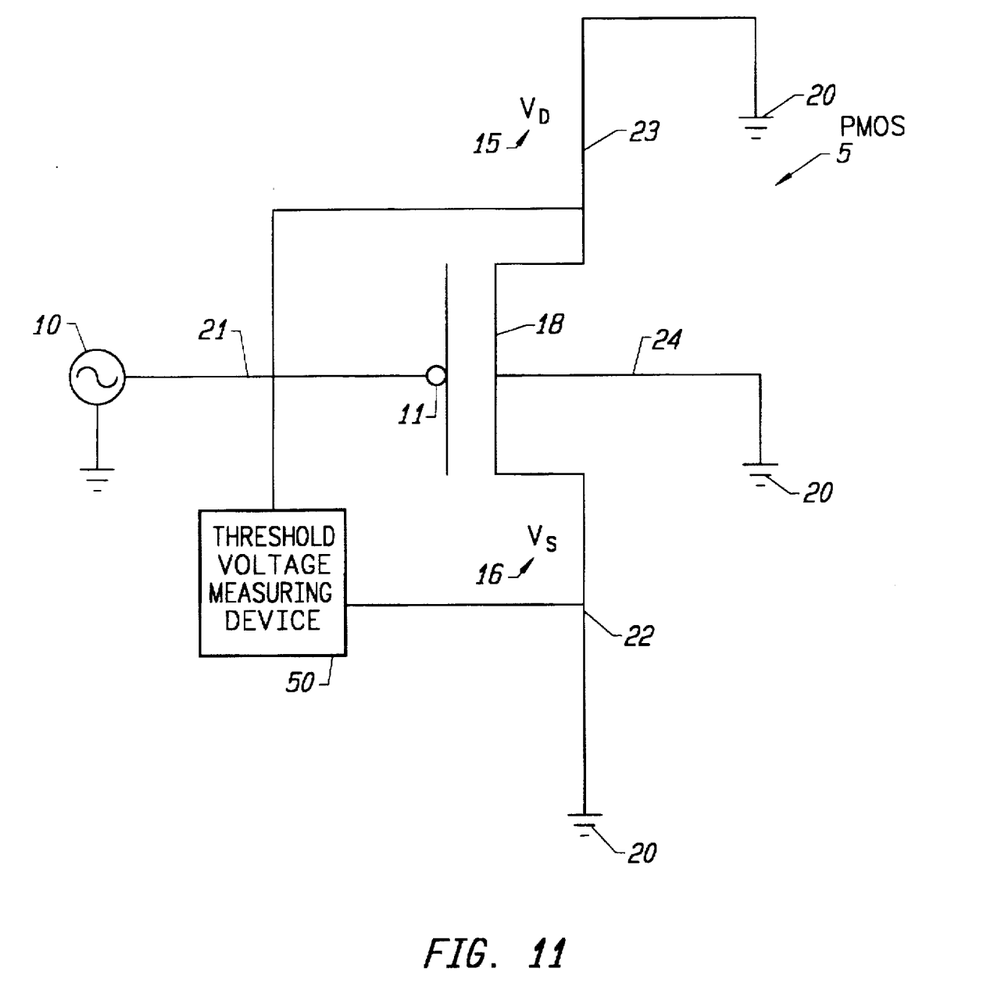
FIG. 11 illustrates a circuit diagram for detecting boron in a PMOS device according to the present invention.

FIG. 10b illustrates a method for detecting boron 12 at interface 12. FIG. 11 illustrates a circuit with like reference numerals for detecting boron. A threshold voltage measuring device 50, or an equivalent thereof, is used to measure threshold voltage. A $V_t$ fluence test is used on PMOS device 5 in order to detect boron concentration at interface 12. In particular, a current source 10 is connected to gate 11 by line 21. $V_D$ 15, $V_S$ 16 and substrate 18 are then connected by lines 23, 22 and 24, respectively to a common ground 20. A negative current is then introduced into gate 11. The negative current can range from approximately –1 mA/cm² to –20 mA/cm². In the preferred embodiment, the current introduced is –6.67 mA/cm². This fluence test accurately and quantitatively detects the concentration of boron at the gate 11/oxide layer 14 interface for various PMOS devices manufactured at different RTA temperatures and implant energies.

Figure 6:
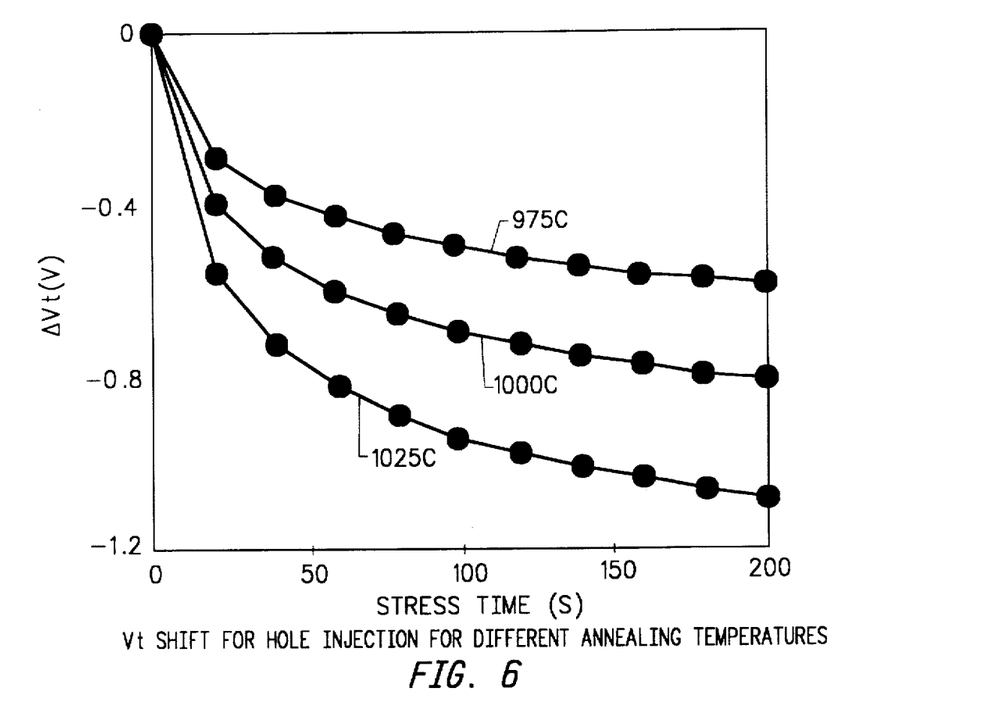
FIG. 6 illustrates changes in threshold voltage ("$V_t$") versus stress time at different RTA temperatures according to the present invention.

FIG. 6 illustrates differences in threshold voltages $V_t$ of PMOS device 5 manufactured at three different RTA temperatures: 975° C., 1,000° C. and 1.025° C. The $V_t$ fluence test illustrates a voltage threshold $V_t$ shift ($\Delta V_t$=voltage after stress–voltage before stress) from about 0.58 to about 1.1 V after introducing −6.67 mA/cm² of current for approximately 200 seconds for a PMOS device 5 manufactured at a 975° C. and 1,025° C. RTA temperature.

Figure 7:
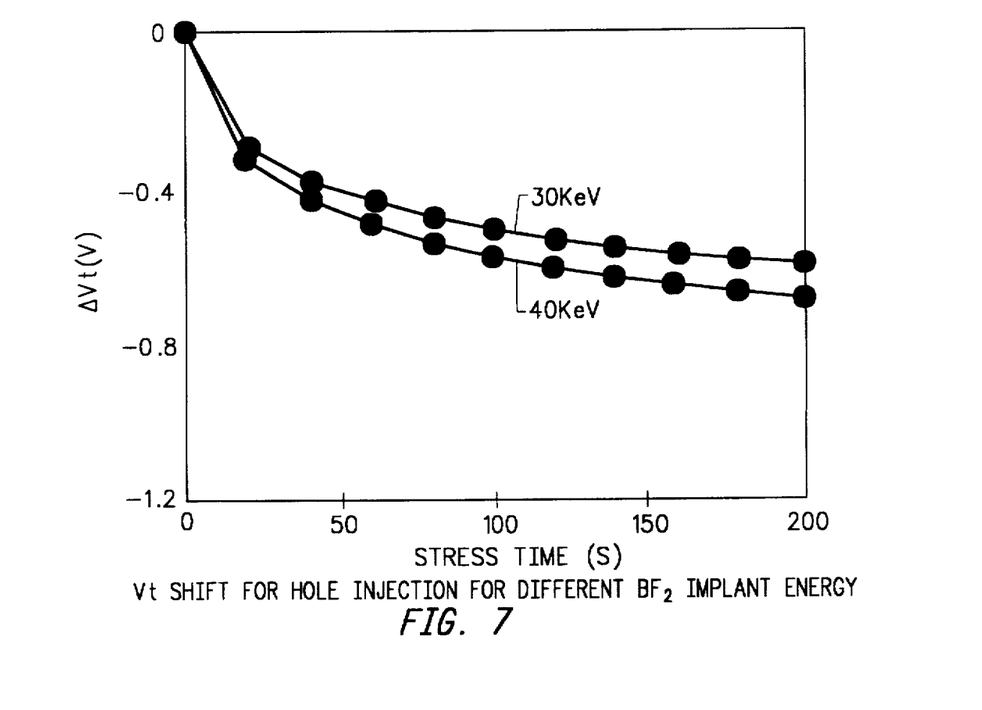
FIG. 7 illustrates changes in threshold voltage ("$V_t$") versus stress time for different $BF_2$ implant energies according to the present invention.

FIG. 7 also illustrates the affect of boron concentration at the interface between gate 11 and oxide layer 14. FIG. 7 illustrates how increases in implant energy during manufacture will result in a change in threshold voltage of PMOS device 5 during stress. In particular, curve 30 KeV and curve 40 KeV illustrate two PMOS 5 devices which have been manufactured with different respective implant energies. The two PMOS devices then undergo a fluence test at −6.67 mA/cm² for approximately 200 seconds. The voltage threshold $V_t$ shift ($\Delta V_t$) is increased from about 0.58 to about 0.68 volts when implant energy is increased from about 30 KeV to about 40 KeV.

Figure 8:
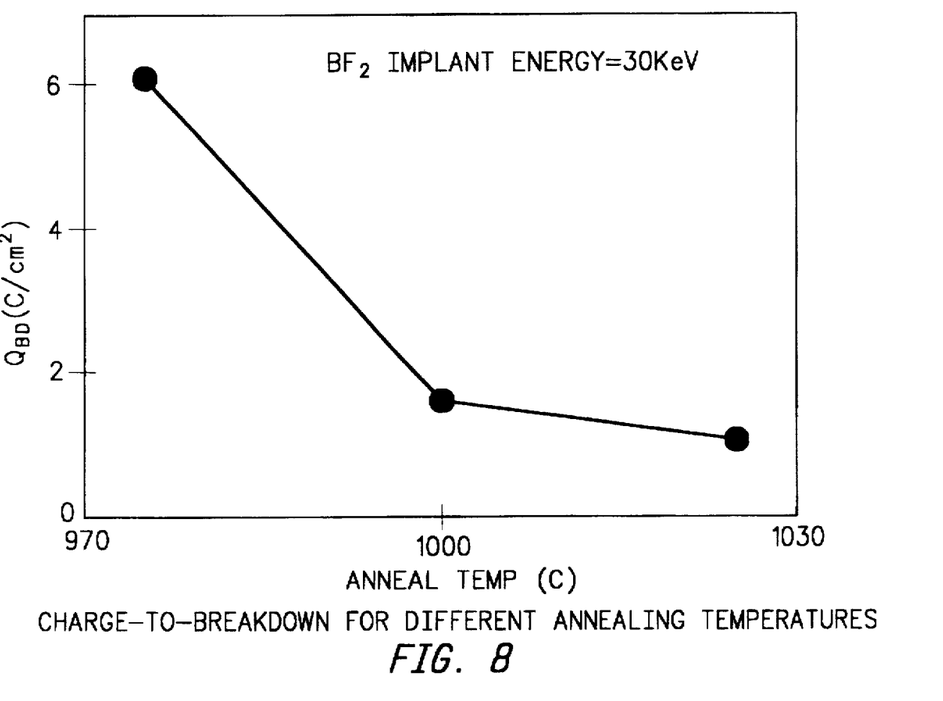
FIG. 8 illustrates a charge-to-breakdown ("$Q_{BD}$") versus different RTA temperatures at an $BF_2$ implant energy of about 30 KeV according to the present invention.

FIG. 8 illustrates a dramatic decrease in charge-to-breakdown $Q_{BD}$ for PMOS devices 5 manufactured under different RTA temperatures and an implant energy of about 30 KeV. As can be seen, charge-to-breakdown $Q_{BD}$ reduces substantially as RTA temperature is increased. Charge-to-breakdown $Q_{BD}$ decreases from about 6 to about 1 C/cm² as RTA temperature is increased from about 975° C. to about 1.025° C. Charge-to-breakdown $Q_{BD}$ similarly decreases from about 6 to about 3 C/cm² as implant energy is increased from about 30 KeV to about 40 KeV.

Figure 9A:
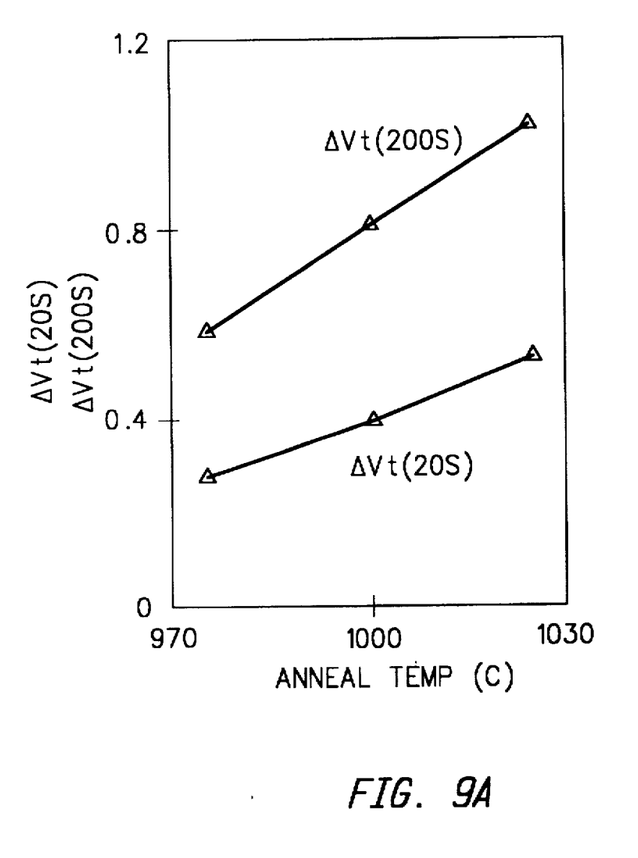
FIGS. 9a–b illustrate changes in threshold voltage ("$V_t$") during different stress times of semiconductor devices which have undergone different RTA temperatures and implant energies.
Figure 9B:
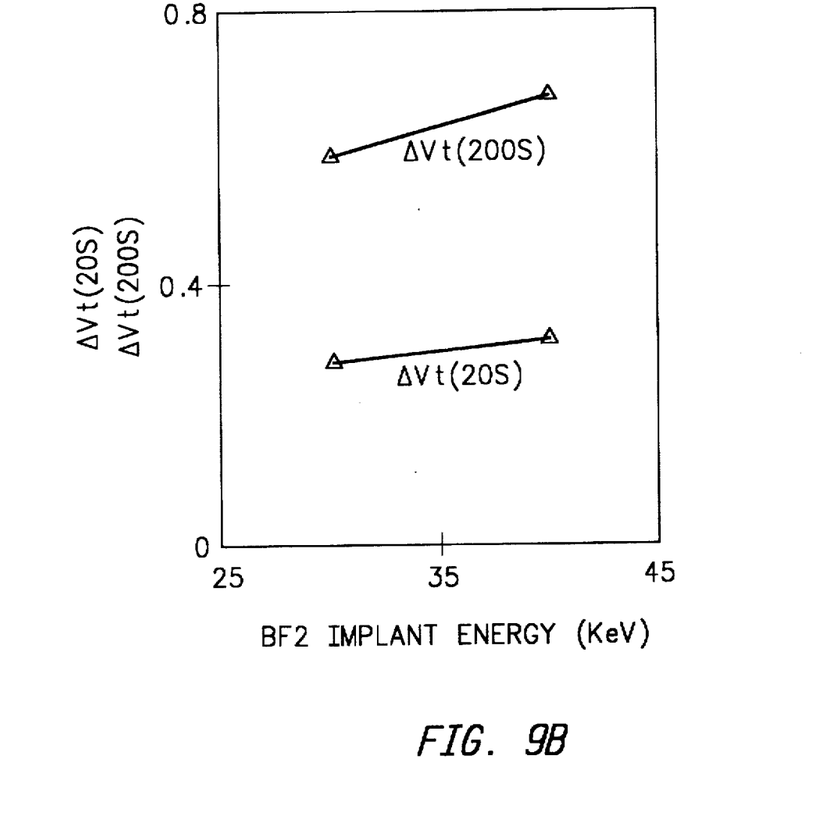

FIGS. 9a–b illustrate the shift in threshold voltage $V_t$ after the $V_t$ fluence test described above. Curve $\Delta V_t$ (200s) illustrates the threshold voltage shift for a (width/length=20 μm/0.35 μm) PMOS device manufactured under different RTA temperatures (975° C. to 1,025° C.) after a 200s stress test. Likewise, curve $\Delta V_t$ (20s) illustrates a threshold voltage shift for different devices manufactured under different RTA temperatures and undergoing a 20s stress test.

FIG. 9b likewise illustrates a threshold voltage shift for a (width/length=20 μm/0.35 μm) PMOS device manufactured under various implant energies. Curve $\Delta V_t$ (200s) illustrates the shift in threshold voltage caused by increases in implant energy after a 200s stress test. Curve $\Delta V_t$ (20s) also illustrates the change in threshold voltage in PMOS devices manufactured with higher implant energy after a 20 second fluence stress test.

Thus, the present invention provides a method and circuit for detecting boron at a p-type polysilicon gate/gate dielectric interface which was previously not detectable by conventional methods and circuits. By detecting boron concentration at the polysilicon gate/gate dielectric, manufacture process steps may be quantifiably altered in order to meet voltage characteristic requirements. Improved manufacturing process steps in turn will lead to higher yields and more reliable semiconductor devices.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method for detecting boron in a semiconductor device having a substrate region, source region, drain region, gate region and gate dielectric region, comprising the steps of:

measuring a first threshold voltage value;
grounding the source region;
grounding the drain region;
grounding the substrate region;
applying a current to the voltage gate region;
measuring a second threshold voltage value; and, comparing the first threshold voltage value to the second threshold voltage value to determine boron concentration at an interface between the gate region and gate dielectric region.

2. The method of claim 1, wherein the current is a negative current.

3. The method of claim 1, wherein the current is in a range of about −1 to −20 mA/cm².

4. The method of claim 1, wherein the current is about −6.67 mA/cm².

5. The method of claim 1, wherein the length of the gate region is about 0.35 μm.

6. The method of claim 1, wherein the gate dielectric region is about 70 Å thick.

7. The method of claim 1, wherein the semiconductor device undergoes a rapid thermal annealing temperature in the range of about 975° C. to about 1025° C.

8. The method of claim 1, wherein the semiconductor device undergoes an implant energy in the range of about 30 KeV to about 40 KeV.

9. The method of claim 1, wherein the source region and drain region has a boron concentration of about $1 \times 10^{15}$/cm².

10. The method of claim 1, wherein the gate region has a boron concentration at about $1 \times 10^{15}$/cm².

11. The method of claim 1, wherein the semiconductor device is used in a microprocessor.

12. The method of claim 1, wherein the semiconductor device is used in a programmable logic device.

13. A method for detecting boron at a p-type polysilicon gate region and $SiO_2$ region interface in a p-channel metal oxide semiconductor ("PMOS") device having a source and a drain on a substrate, the p-type polysilicon gate region forming a gate substantially over the $SiO_2$ region, comprising the steps of:

grounding the source;
grounding the drain;
grounding the substrate;
injecting current into the p-type polysilicon region; and,
measuring the threshold voltage of a PMOS device.

14. The method of claim 13, wherein the measuring step includes the steps of:

measuring a first threshold voltage value before the injecting step;
measuring a second threshold voltage value after the injecting step; and,
comparing the first threshold voltage value and the second threshold voltage value in order to determine the amount of boron at the interface.

15. The method of claim 13, wherein the current is a negative current.

16. The method of claim 13, wherein the current is in a range of about −1 to −20 mA/cm².

17. The method of claim 13, wherein the current is about −6.67 mA/cm².

18. The method of claim 13, wherein the length of the gate region is about 0.35 μm.

19. The method of claim 13, wherein the $SiO_2$ region is about 70 Å thick.

20. The method of claim 13, wherein the PMOS semiconductor device undergoes a rapid thermal annealing temperature in the range of about 975° C. to about 1025° C.

21. The method of claim 13, wherein the PMOS semiconductor device undergoes an implant energy in the range of about 30 KeV to about 40 KeV.

22. The method of claim 13, wherein the source and drain has a boron concentration of $1\times10^{15}/cm^2$.

23. The method of claim 13, wherein the gate region has a boron concentration at about $1\times10^{15}/cm^2$.

24. The method of claim 13, wherein the PMOS device is used in a microprocessor.

25. The method of claim 13, wherein the PMOS device is used in a programmable logic device.

26. A circuit for detecting boron in a positive metal oxide semiconductor ("PMOS") device at an interface between a PMOS gate and a PMOS gate dielectric comprising:

a negative current source, coupled to the PMOS gate, for providing a negative current;

a ground, coupled to 1) a PMOS source; 2) a PMOS drain, and 3) a PMOS substrate, providing a ground potential; and, means, coupled to the PMOS gate and PMOS source, for measuring threshold voltage indicating the amount of boron at the interface.

27. The circuit of claim 26, wherein the current is approximately $-6.67$ mA/cm$^2$.

28. The circuit of claim 26, wherein the current is applied for approximately 200 seconds.

* * * * *

UNITED STATES PATENT AND TRADEMARK OFFICE
CERTIFICATE OF CORRECTION

PATENT NO. : 5,757,204
DATED : May 26, 1998
INVENTOR(S) : Nayak et al.

It is certified that error appears in the above-indentified patent and that said Letters Patent is hereby corrected as shown below:

In the title, after "Voltage" and before "Fluence", please delete "("V")" and substitute therefor --("$V_t$")--.

Column 1, line 60, after "manufacturing" and before "modified", please add the words --processes may be--.

Signed and Sealed this

Fifteenth Day of September, 1998

Attest:

BRUCE LEHMAN

*Attesting Officer*   *Commissioner of Patents and Trademarks*